(12) United States Patent
Masubuchi et al.

(10) Patent No.: US 12,094,866 B2
(45) Date of Patent: *Sep. 17, 2024

(54) SEMICONDUCTOR MEMORY SYSTEM

(71) Applicant: Kioxia Corporation, Minato-ku (JP)

(72) Inventors: Hayato Masubuchi, Kanagawa (JP); Naoki Kimura, Kanagawa (JP); Manabu Matsumoto, Kanagawa (JP); Toyota Morimoto, Kanagawa (JP)

(73) Assignee: Kioxia Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,693

(22) Filed: May 31, 2023

(65) Prior Publication Data

US 2023/0307433 A1   Sep. 28, 2023

Related U.S. Application Data

(63) Continuation of application No. 17/342,748, filed on Jun. 9, 2021, now Pat. No. 11,705,444, which is a
(Continued)

(30) Foreign Application Priority Data

Mar. 16, 2011   (JP) .................. 2011-058140

(51) Int. Cl.
G11C 5/02 (2006.01)
H01L 23/00 (2006.01)
(Continued)

(52) U.S. Cl.
CPC ............ H01L 25/18 (2013.01); G11C 5/02 (2013.01); H01L 23/3142 (2013.01);
(Continued)

(58) Field of Classification Search
CPC .......... G11C 5/025; G11C 5/04; G11C 5/063; H01L 27/115
(Continued)

(56) References Cited

U.S. PATENT DOCUMENTS 5,628,852 A   5/1997   Ishida
6,329,610 B1   12/2001   Takubo et al.
(Continued)

FOREIGN PATENT DOCUMENTS

CN   101622609 A   1/2010
CN   101952956 A   1/2011
(Continued)

OTHER PUBLICATIONS

Japanese Office Action issued May 14, 2013 in Patent Application No. 2011-058140 (w/English translation).
(Continued)

Primary Examiner — Son T Dinh
(74) Attorney, Agent, or Firm — Oblon, McClelland, Maier & Neustadt, L.L.P.

(57) ABSTRACT

According to one embodiment, a semiconductor memory system includes a substrate, a plurality of elements and an adhesive portion. The substrate has a multilayer structure in which wiring patterns are formed, and has a substantially rectangle shape in a planar view. The elements are provided and arranged along the long-side direction of a surface layer side of the substrate. The adhesive portion is filled in a gap between the elements and in a gap between the elements and the substrate, where surfaces of the elements are exposed.

9 Claims, 11 Drawing Sheets

Related U.S. Application Data continuation of application No. 16/800,398, filed on Feb. 25, 2020, now Pat. No. 11,063,031, which is a continuation of application No. 16/502,288, filed on Jul. 3, 2019, now Pat. No. 10,607,979, which is a continuation of application No. 15/822,039, filed on Nov. 24, 2017, now Pat. No. 10,388,640, which is a continuation of application No. 15/378,947, filed on Dec. 14, 2016, now Pat. No. 9,859,264, which is a continuation of application No. 15/254,825, filed on Sep. 1, 2016, now Pat. No. 9,754,632, which is a continuation of application No. 14/511,676, filed on Oct. 10, 2014, now Pat. No. 9,437,533, which is a continuation of application No. 14/324,683, filed on Jul. 7, 2014, now Pat. No. 9,312,215, which is a continuation of application No. 13/418,619, filed on Mar. 13, 2012, now Pat. No. 8,873,265.

(51) Int. Cl.

| | | |
|---|---|---|
| *H01L 23/31* | (2006.01) | |
| *H01L 23/498* | (2006.01) | |
| *H01L 23/528* | (2006.01) | |
| *H01L 23/552* | (2006.01) | |
| *H01L 25/00* | (2006.01) | |
| *H01L 25/065* | (2023.01) | |
| *H01L 25/18* | (2023.01) | |
| *H05K 1/02* | (2006.01) | |
| *H05K 1/18* | (2006.01) | |
| *H05K 3/30* | (2006.01) | |
| *H10B 69/00* | (2023.01) | |

(52) U.S. Cl.
CPC .. *H01L 23/49822* (2013.01); *H01L 23/49838* (2013.01); *H01L 23/5286* (2013.01); *H01L 23/552* (2013.01); *H01L 23/562* (2013.01); *H01L 25/0655* (2013.01); *H01L 25/50* (2013.01); *H05K 1/0225* (2013.01); *H05K 1/0271* (2013.01); *H05K 1/0298* (2013.01); *H05K 1/181* (2013.01); *H05K 3/305* (2013.01); *H10B 69/00* (2023.02); *H01L 23/3121* (2013.01); *H01L 2924/0002* (2013.01); *H05K 2201/09136* (2013.01); *H05K 2201/09681* (2013.01); *H05K 2201/10159* (2013.01); *Y02P 70/50* (2015.11)

(58) Field of Classification Search
USPC ...................................................... 365/51, 63
See application file for complete search history.

(56) References Cited

U.S. PATENT DOCUMENTS

| | | | |
|---|---|---|---|
| 7,009,190 | B1 | 8/2006 | Noguchi |
| 8,379,426 | B2 | 2/2013 | Bang et al. |
| 8,873,265 | B2 | 10/2014 | Masubuchi |
| 9,312,215 | B2 | 4/2016 | Masubuchi |
| 9,437,533 | B2 * | 9/2016 | Masubuchi ....... H01L 23/49822 |
| 9,859,264 | B2 | 1/2018 | Masubuchi et al. |
| 2003/0173640 | A1 | 9/2003 | Ando |
| 2006/0055501 | A1 * | 3/2006 | Burke ..................... H01C 7/18 338/22 R |
| 2006/0157382 | A1 | 7/2006 | Yasufuku et al. |
| 2006/0249829 | A1 | 11/2006 | Katagiri et al. |
| 2008/0257584 | A1 | 10/2008 | Wada et al. |
| 2009/0068829 | A1 | 3/2009 | Lee |
| 2010/0073860 | A1 | 3/2010 | Moriai et al. |
| 2010/0091539 | A1 | 4/2010 | Bang et al. |
| 2010/0153625 | A1 | 6/2010 | Sugita et al. |
| 2010/0327457 | A1 | 12/2010 | Mabuchi |
| 2012/0235141 | A1 | 9/2012 | Masubuchi et al. |

FOREIGN PATENT DOCUMENTS

| | | |
|---|---|---|
| CN | 1845325 A | 10/2011 |
| JP | 3-129843 | 6/1991 |
| JP | 5-13982 | 1/1993 |
| JP | 7-202359 | 8/1995 |
| JP | 7-235776 | 9/1995 |
| JP | 8-195566 | 7/1996 |
| JP | 9-275251 | 10/1997 |
| JP | 10-32388 | 2/1998 |
| JP | 10-120075 | 5/1998 |
| JP | 10-154774 A | 6/1998 |
| JP | 11-68313 | 3/1999 |
| JP | 2000-133941 | 5/2000 |
| JP | 2002-198449 | 7/2002 |
| JP | 2002-261402 | 9/2002 |
| JP | 2003-258189 A | 9/2003 |
| JP | 2004-342934 | 12/2004 |
| JP | 2004-363347 | 12/2004 |
| JP | 2005-123493 | 5/2005 |
| JP | 2005-136232 | 5/2005 |
| JP | 2006-5043 | 1/2006 |
| JP | 2006-108289 | 4/2006 |
| JP | 2007-149829 A | 6/2007 |
| JP | 2007-227942 | 9/2007 |
| JP | 2007-311723 | 11/2007 |
| JP | 2008-71963 | 3/2008 |
| JP | 2008-177516 | 7/2008 |
| JP | 2009-152282 | 7/2009 |
| JP | 2009-163409 | 7/2009 |
| JP | 2009-267162 | 11/2009 |
| JP | 2010-79445 | 4/2010 |
| JP | 2010-97686 | 4/2010 |
| JP | 2010-114137 | 5/2010 |
| JP | 2010-135418 | 6/2010 |
| JP | 2012-195440 | 10/2012 |
| TW | 535470 B | 6/2003 |

OTHER PUBLICATIONS

Written Demand for Invalidation Trial, 2016-800120, Nov. 10, 2016, 61 pages (no English translation).
Yaurichi Enomoto and Hisashi Mamizuka, "Analysis for warp mechanism at reflow soldering POB Assembly" (partial English Summary), 2006 vol. 16 No. 1, http:/pioneer.jp/crdl_design/crdl/rd/16-1.php, 14 pages.
Seiji Matsunaga and Hisashi Mamizuke, "Evaluation of a system for the analysis of the generation mechanism of PCB warping in reflow soldering" (partial English Summary), Pioneer R&D (vol. 18, Feb. 2008) http://pioneer.i/corp/crdl_design/crdl/rd/18-2.php 11 pages.
Fujitsu The Possibilities Are Infinite, Oct. 3, 2008, 3267148, http://jp.fujitsu.com/about/ip/ipdisclosure/ 24 pages (no English translation).
Transcend Exceeding Your Expectations, 10, PCB Layout Drawing, Apr. 21, 2009, Project Code SSD25S-IDX110—PCB 29-8370, (partial English translation) 3 pages.
STACK—UP Specification, FR-4 8 Layer, 14 pages.
Transcend Exceeding Your Expectations, "Component Specification" , Component P/N 29-8370, Version 1.0, 2 pages (partial English translation).
LTEC Corporation, No. 16H-0438-1 Rev. 1, Transcend SSD, Sep. 15, 2016, 27 pages (partial English translation).
Transcend, "Product Overview", 1-3, www.transcend.com.tw (in English), 4 pages.
2.5 & 1.8 SSD, TS256GSSD25S-M, 1-4, http:/kakaku.com/item/K0000135648/, (no English), 6 pages.
Amazon.co.jp: 512GB SSD 2.5 SATA MLC TS512GSSD25S-M, 1-5, Oct. 14, 2016, 3 pages (no English translation).
260MB 512GB SSD, 1-6, http://news.kakaku.com/prdnews/cd=pc/ctcd=0537/id=12672, Sep. 10, 2010, (no English translation), 3 pages.

(56) References Cited

OTHER PUBLICATIONS

Office Action issued Sep. 24, 2013 in Japanese Application No. 2013-146692 (w/English translation).
Action issued Sep. 24, 2013 in Japanese Application No. 2011-058140 (w/English translation).
Office Action mailed Jun. 13, 2014 in Chinese Patent Application No. 201210052225.2 (w/English translation).
Office Action issued Apr. 26, 2016 in Taiwanese Patent Application No. 104125728 (w/English translation).
Office Action issued Nov. 3, 2015 in Chinese Patent Application No. 201210052225.2 (w/English translation).
Office Action issued on Jun. 19, 2015 in Chinese Patent Application No. 201210052225.2 (w/English translation).
Office Action issued Jun. 30, 2015 in Japanese Patent Application No. 2014-134709 (w/English translation).
"Analysis on Latest Version of MacBook Air for Revealing Secret That Makes It Thin and Low-priced" Nikkei Electronics, Nikkei Business Publications, Inc., vol. 1045, Dec. 13, 2010, pp. 83-90.
Japanese Office Action issued Mar. 31, 2015 in Patent Application No. 2014-134709 (w/English translation).
Office Action issued on Jan. 22, 2015 in Chinese Patent Application No. 201210052225.2 (w/English translation).
Taiwanese Office Action issued Oct. 22, 2014 in Taiwan Patent Application No. 101106090 (w/English translation).
Office Action issued Nov. 1, 2016 in Japanese Patent Application No. 2015-252510 (w/English translation).
512 GB, 1-7, http://www.transcend.co.jp/Products/ModDetail.asp?ModNo=177&LangNo=17&Func1No=&Func2No=, Sep. 10, 2010, (no English translation) 1 page.
Pronouncement of Decision mailed May 23, 2019 in Japanese Patent No. 5869058 (w/computer-generated English translation).

\* cited by examiner

FIG.5

| | | WIRING LAYER (COPPER FOIL) | WIRING DENSITY | WIRING DENSITY |
|---|---|---|---|---|
| UPPER LAYER | FIRST LAYER | SIGNAL LAYER (COMPONENT-MOUNTED SURFACE) | APPROXI- MATELY 60 % | APPROXI- MATELY 60 % |
| | SECOND LAYER | PLANE LAYER (GND) | APPROXI- MATELY 80 % | |
| | THIRD LAYER | SIGNAL LAYER | APPROXI- MATELY 50 % | |
| | FOURTH LAYER | SIGNAL LAYER | APPROXI- MATELY 50 % | |
| LOWER LAYER | FIFTH LAYER | PLANE LAYER (POWER SUPPLY) | APPROXI- MATELY 80 % | APPROXI- MATELY 60 % TO 67.5 % |
| | SIXTH LAYER | SIGNAL LAYER | APPROXI- MATELY 50 % | |
| | SEVENTH LAYER | PLANE LAYER (GND) | APPROXI- MATELY 80 % | |
| | EIGHTH LAYER | NET WIRING LAYER (GND) | APPROXI- MATELY 30 % TO 60 % | |

FIG.6

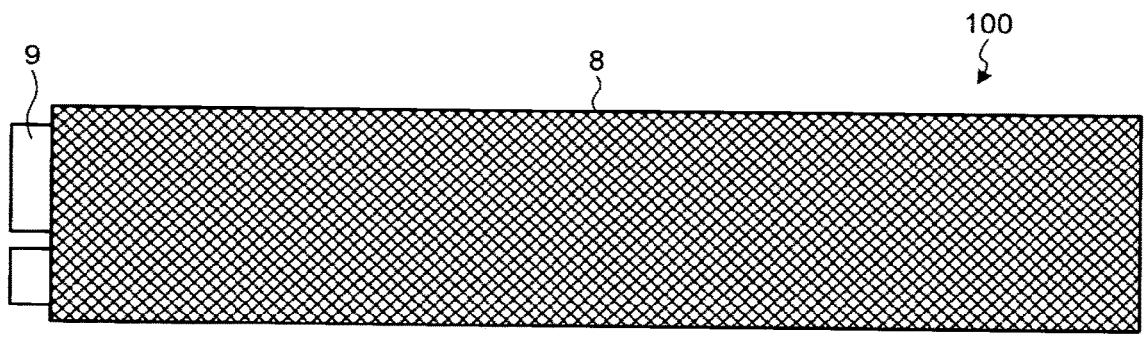

FIG.7

|  |  | WIRING LAYER (COPPER FOIL) | WIRING DENSITY | WIRING DENSITY |
|---|---|---|---|---|
| UPPER LAYER | FIRST LAYER | SIGNAL LAYER (COMPONENT-MOUNTED SURFACE) | APPROXI-MATELY 60 % | APPROXI-MATELY 60 % |
|  | SECOND LAYER | PLANE LAYER (GND) | APPROXI-MATELY 80 % |  |
|  | THIRD LAYER | SIGNAL LAYER | APPROXI-MATELY 50 % |  |
|  | FOURTH LAYER | SIGNAL LAYER | APPROXI-MATELY 50 % |  |
| LOWER LAYER | FIFTH LAYER | PLANE LAYER (POWER SUPPLY) | APPROXI-MATELY 80 % | APPROXI-MATELY 75 % |
|  | SIXTH LAYER | SIGNAL LAYER | APPROXI-MATELY 50 % |  |
|  | SEVENTH LAYER | PLANE LAYER (GND) | APPROXI-MATELY 80 % |  |
|  | EIGHTH LAYER | PLANE LAYER (GND) | APPROXI-MATELY 90 % |  |

FIG.8

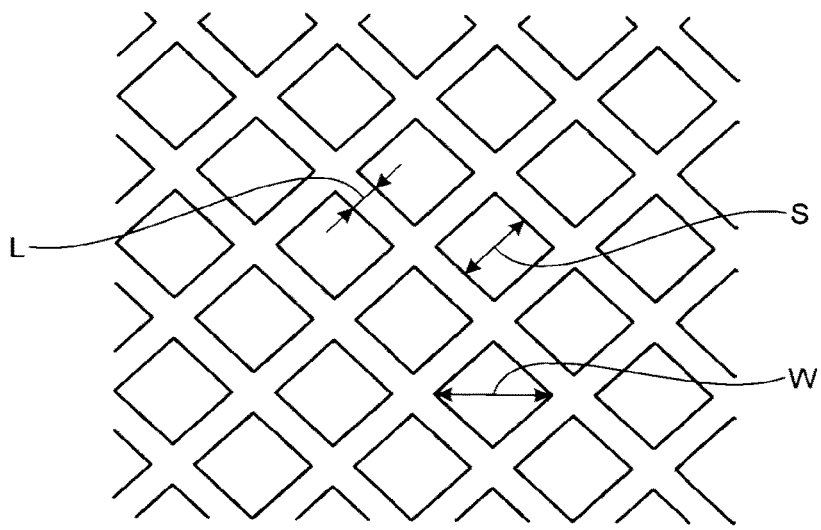

US 12,094,866 B2

SEMICONDUCTOR MEMORY SYSTEM

CROSS-REFERENCE TO RELATED APPLICATIONS

This application is a continuation of and claims the benefit of priority under 35 U.S.C. § 120 from U.S. application Ser. No. 17/342,748 filed Jun. 9, 2021, which is a continuation of U.S. application Ser. No. 16/800,398 filed Feb. 25, 2020 (now U.S. Pat. No. 11,063,031 issued Jul. 13, 2021), which is a continuation of U.S. application Ser. No. 16/502,288 filed Jul. 3, 2019 (now U.S. Pat. No. 10,607,979 issued Mar. 31, 2020), which is a continuation of U.S. application Ser. No. 15/822,039 filed Nov. 24, 2017 (now U.S. Pat. No. 10,388,640 issued Aug. 20, 2019), which is a continuation of U.S. application Ser. No. 15/378,947 filed Dec. 14, 2016 (now U.S. Pat. No. 9,859,264 issued Jan. 2, 2018), which is a continuation of U.S. application Ser. No. 15/254,825 filed Sep. 1, 2016 (now U.S. Pat. No. 9,754,632 issued Sep. 5, 2017), which is a continuation of U.S. application Ser. No. 14/511,676 filed Oct. 10, 2014 (now U.S. Pat. No. 9,437,533 issued Sep. 6, 2016), which is a continuation of U.S. application Ser. No. 14/324,683 filed Jul. 7, 2014 (now U.S. Pat. No. 9,312,215 issued Apr. 12, 2016), which is a continuation of U.S. application Ser. No. 13/418,619 filed Mar. 13, 2012 (now U.S. Pat. No. 8,873,265 issued Oct. 28, 2014), which claims the benefit of priority under 35 U.S.C. § 119 from Japanese Patent Application No. 2011-058140 filed Mar. 16, 2011; the entire contents of each of which are incorporated herein by reference.

FIELD

Embodiments described herein relate generally to a semiconductor memory system.

BACKGROUND

In a process for manufacturing a semiconductor device, a method has been employed, using a semiconductor memory system mounting nonvolatile semiconductor storage elements such as an NAND flash memory on a substrate in which a connector is formed. Also, in the semiconductor memory system, in addition to the nonvolatile semiconductor storage elements, high-speed semiconductor storage elements and a controller that controls the high-speed semiconductor storage elements and the non-volatile semiconductor storage elements are mounted.

In such a semiconductor memory system, there is a case where the substrate shape and size are restricted according to the usage environment and the standard, for example, there is a case where a substrate having a rectangle shape in a planar view is used. Also, according to a miniaturization request to a recent semiconductor memory system, a substrate tends to become thinner. In the case of using such a thinned rectangle-shaped substrate, the warpage of substrate is requested to be suppressed.

BRIEF DESCRIPTION OF THE DRAWINGS

FIG. 5 is a view of the wiring density of each substrate layer;

FIG. 6 is a view of a wiring pattern formed on a rear surface layer (or the eighth layer) of the substrate;

FIG. 7 is a view of the wiring density of each substrate layer as a comparison example;

FIG. 8 is a view for explaining the line width and interval of the wiring pattern formed on the rear surface layer (or the eighth layer) of the substrate;

DETAILED DESCRIPTION

In general, according to one embodiment, the semiconductor memory system includes a substrate, nonvolatile semiconductor storage elements and an adhesive portion. The substrate has a multilayer structure in which wiring patterns are formed, and has a substantially rectangle shape in a planar view. The nonvolatile semiconductor storage elements are provided and arranged along the longitudinal direction on a surface layer side of the substrate. The adhesive portion is filled in a gap between the nonvolatile semiconductor storage elements and in a gap between the nonvolatile semiconductor storage elements and the substrate, where the surfaces of the nonvolatile semiconductor storage elements are exposed.

Exemplary embodiments of the semiconductor memory system will be explained below in detail with reference to the accompanying drawings. The present invention is not limited to the following embodiments.

Figure 1:
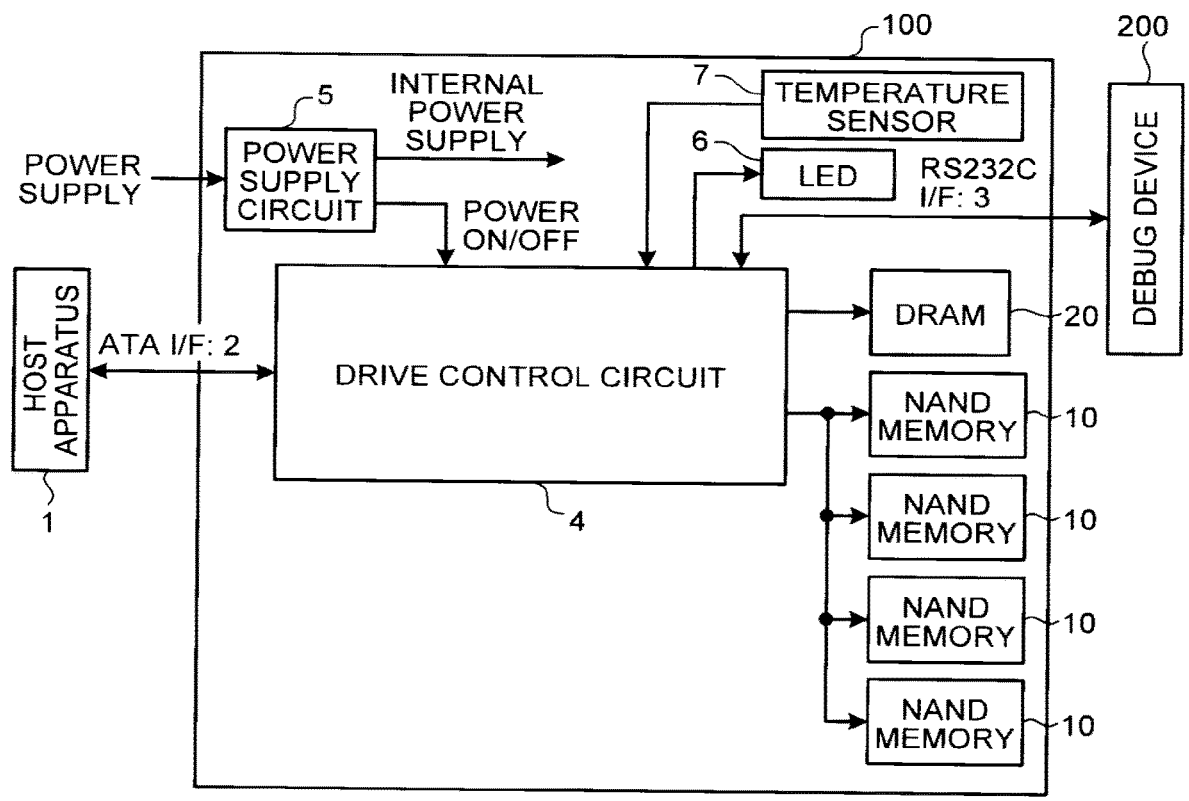
FIG. 1 is a block diagram of a configuration example of a semiconductor memory system according to a first embodiment.

FIG. 1 is a block diagram of a configuration example of a semiconductor memory system according to a first embodiment. A semiconductor memory system 100 is connected to a host apparatus (hereinafter abbreviated to "host") 1 such as a personal computer and a CPU core via a memory connection interface such as a SATA interface (ATA I/F) 2, and functions as an external memory of the host 1. Examples of the host 1 include a personal computer CPU and a CPU of an imaging apparatus such as a still camera and a video camera. Also, the semiconductor memory system 100 can transmit and receive data with a debug device 200 via a communication interface 3 such as an RS232C interface ("RS232C I/F").

The semiconductor memory system 100 is provided with NAND-type flash memories (hereinafter abbreviated to "NAND memories") 10 as nonvolatile semiconductor storage elements (elements), a drive control circuit (element) 4 as a controller, a volatile DRAM 20 as a high-speed semiconductor storage element (element) that can perform faster storage operations than the NAND memories 10, a power supply circuit 5, a state display LED 6 and a temperature sensor 7 that detects the temperature inside the drive. The temperature sensor 7 directly or indirectly measures the temperature of the NAND memories 10, for example. If a measurement result by the temperature sensor 7 is equal to or higher than a predetermined temperature, the drive control circuit 4 restricts the writing of information into the NAND memories 10 and suppresses an increase in temperature.

Here, as a nonvolatile semiconductor storage element, a lamination-type NAND flash memory or an ReRAM (Resistive Random Access Memory) may be used. Also, as a high-speed semiconductor storage element, a nonvolatile MRAM (Magnetoresistive Random Access Memory) may be used. The MRAM may have a magnetic screening portion to suppress intrusion of magnetism therein. Also, in a case where the MRAM itself does not have the magnetic screening portion, a periphery coverer (not shown) to suppress a magnetic entry by covering the periphery of the MRAM or the NAND memories 10 may be provided.

The power supply circuit 5 generates a plurality of different internal direct-current power supply voltages from an external direct-current power supply voltage supplied from a power supply circuit on the side of the host 1, and supplies these internal direct-current power supply voltages to each circuit inside the semiconductor memory system 100. Further, the power supply circuit 5 detects the rise of the external power supply, generates a power-on reset signal and supplies it to the drive control circuit 4.

Figure 2A:
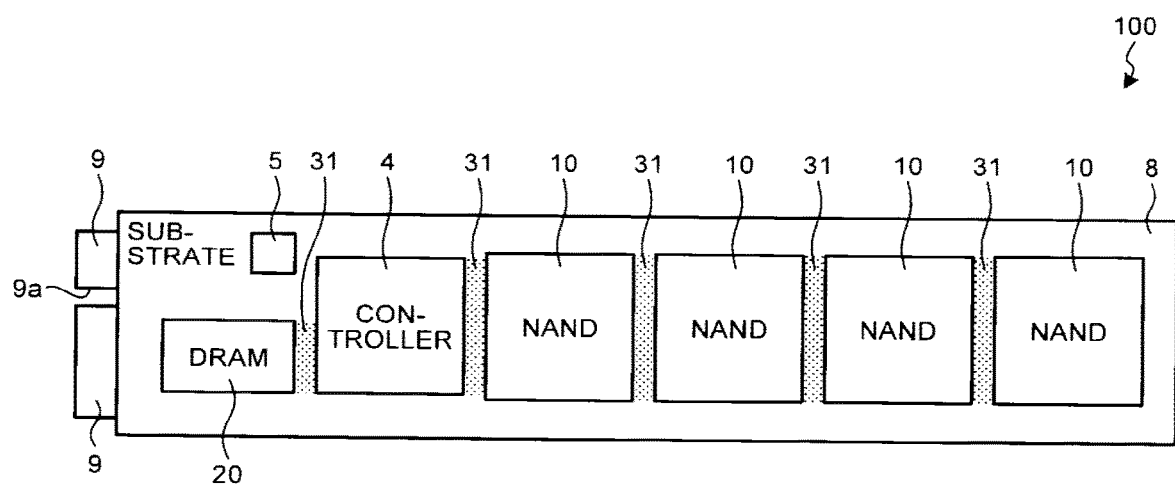
FIG. 2A is a plan view of a schematic configuration of a semiconductor memory system.
Figure 3A:
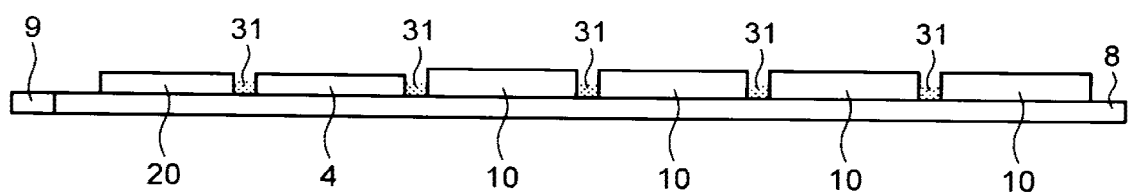
FIG. 3A is a side view of the semiconductor memory system shown in FIG. 2A.

FIG. 2A is a plan view of a schematic configuration of the semiconductor memory system 100. FIG. 3A is a side view of the semiconductor memory system 100 shown in FIG. 2A. The power supply circuit 5, the DRAM 20, the drive control circuit 4 and the NAND memories 10 are mounted on a substrate 8 in which wiring patterns are formed. The substrate 8 has a substantially rectangle shape in a planar view. On the side of one short side of the substrate 8 having a substantially rectangle shape, a connector 9 connectable to the host 1 is provided. The connector 9 functions as the SATA interface 2 and the communication interface 3 described above. The connector 9 functions as a power supply inputting portion that supplies the power supply input from the host 1 to the power supply circuit 5. The connector 9 may be an LIF connector, for example. Also, in the connector 9, a slit 9a is formed in a position shifted from the center position along the short-side direction of the substrate 8, and fits with, for example, a projection (not shown) provided on the side of the host 1. By this means, it is possible to prevent the semiconductor memory system 100 from being attached reversely.

Figure 4:
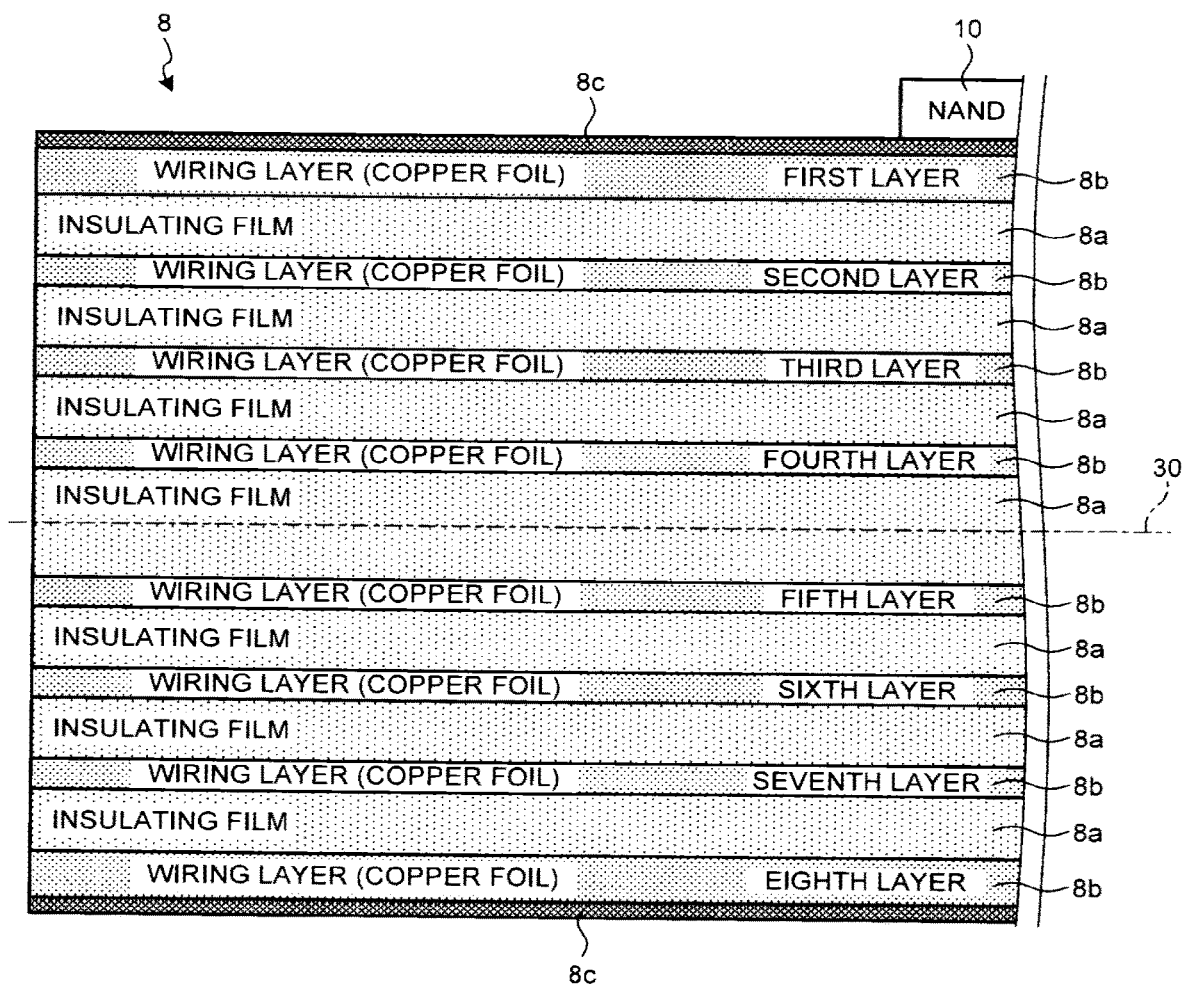
FIG. 4 is a view of a substrate layer configuration.

The substrate 8 has a multilayer structure formed by layering synthetic resins and has eight-layer structure, for example. Here, the number of layers of the substrate 8 is not limited to eight. FIG. 4 is a view of a layer configuration of the substrate 8. In the substrate 8, a wiring pattern is formed in various forms as a wiring layer Sb in the surface or inner layer of each layer (insulating film 8a) formed with synthetic resins. The wiring pattern is formed with a copper, for example. Via the wiring pattern formed on the substrate 8, the power supply circuit 5, the DRAM 20, the drive control circuit 4 and the NAND memories 10 mounted on the substrate 8 are electrically connected to each other. Also, the surface (on the first layer side) and rear surface (on the eighth layer side) of the substrate are covered by a solder resist 8c as a protection film.

FIG. 5 is a view of the wiring density of each layer of the substrate 8. Here, the first to fourth layers formed on the surface layer side compared to a center line 30 (see FIG. 4) of the layer configuration of the substrate 8 are collectively referred to as "upper layer" and the fifth to eighth layers formed on the rear surface layer side compared to the center line 30 are collectively referred to as "lower layer."

As shown in FIG. 5, the wiring layer 8b formed in each layer of the substrate 8 functions as a signal layer for signal transmission and reception, a ground and a plane layer which is a power line. Then, the wiring density of the wiring pattern formed in each layer, that is, the ratio of a wiring layer to the surface area of the substrate 8 is as shown in FIG. 5.

In the present embodiment, the eighth layer functioning as a ground is formed as a meshed pattern wiring layer instead of a plane layer, so that the wiring density is suppressed to 30% to 60%. Here, in the entire upper layer of the substrate 8, the wiring density is 60%. Therefore, by forming a wiring pattern with the wiring density of approximately 30% of the eighth layer, it is possible to set the wiring density of the entire lower layer to 60% and make the wiring density of the entire upper layer and the wiring density of the entire lower layer substantially equal. Also, by adjusting the wiring density of the eighth layer within a range of approximately 30% to 60%, the wiring density is made substantially equal to the wiring density of the entire upper layer.

FIG. 6 is a view of a wiring pattern formed on a rear surface layer (or the eighth layer) of the substrate 8. As shown in FIG. 6, the wiring pattern is formed in a meshed pattern in the rear surface layer (or the eighth layer) of the substrate 8. Thus, by forming the eighth layer of the substrate 8 with a net wiring layer, the wiring density is kept lower, compared to a case where a plane layer is formed.

A wiring layer formed in the rear surface layer is also requested to function as a shield layer to alleviate the influence of noise which is leaked from the semiconductor memory system 100 and given to other apparatuses. FIG. 8 is a view for explaining the line width and interval of the wiring pattern formed on the rear surface layer (or the eighth layer) of the substrate. As shown in FIG. 8, a net wiring is formed on the eighth layer of the substrate 8, where line width L is 0.3 mm and line interval S is 0.9 mm. In the meshed pattern wiring formed in this way, open width W is $0.9 \times \sqrt{2} = 1.27$ mm.

For example, a shield effect to noise of radio frequency such as a SATA fundamental wave of 3 GHz is as follows. First, from $C = f \times \lambda \times \sqrt{\varepsilon}$, the ½ wavelength ($\lambda/2$) of second harmonic wave of the SATA fundamental wave is calculated. Here, "C" represents the light speed of $3.0 \times 10^8$ m/s. Further, "f" represents frequency of the second harmonic wave and has a value of $6.0 \times 10^9$ Hz. Further, "$\varepsilon$" represents a relative permittivity of 4.6.

According to the above conditions, $\lambda$ is 23.3 mm and the ½ wavelength ($\lambda/2$) is 11.7 mm. That is, the ½ wavelength ($\lambda/2$) is about ten times of open width W (1.27 mm). Also, $\lambda/20$ is 1.2 mm, which is substantially equal to open width W, and therefore the shield effect is about −20 dB.

Figure 9:
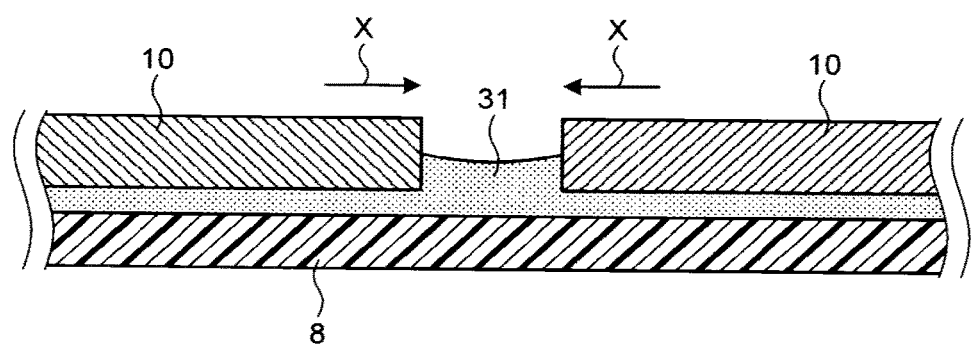
FIG. 9 is a view of an adhesive portion in which the gap between NAND memories is filled.

FIG. 9 is a view of an adhesive portion in which the gap between NAND memories is filled. As shown in FIG. 9, an adhesive portion 31 configured with synthetic resin materials is filled in a gap between the NAND memories 10 and the substrate 8, which bonds the NAND memories 10 and the substrate 8. Further, the adhesive portion 31 is partially protruded from the gap between the NAND memories 10 and the substrate 8. The protruded part is filled in the gap between the NAND memories 10 arranged along the long-side direction of the substrate 8. Therefore, the adhesive portion 31 bonds the NAND memories 10 on their side surfaces. Here, the adhesive portion 31 is protruded to the extent that it does not exceed the height of the NAND memories 10, and therefore the surfaces of the NAND memories 10 are exposed. Also, in FIG. 9, although the adhesive portion 31 is filled to around the intermediate part of the height of the NAND memories 10, it may be filled to a lower part, and an essential requirement is that the adhesive portion 31 touches adjacent NAND memories 10. It is natural that the adhesive portion 31 may be filled between the NAND memories 10 to be higher than the height shown in FIG. 9. Also, the adhesive portion 31 is filled between the controller 4 and the NAND memories and between the controller 4 and the DRAM 20.

Figure 2B:
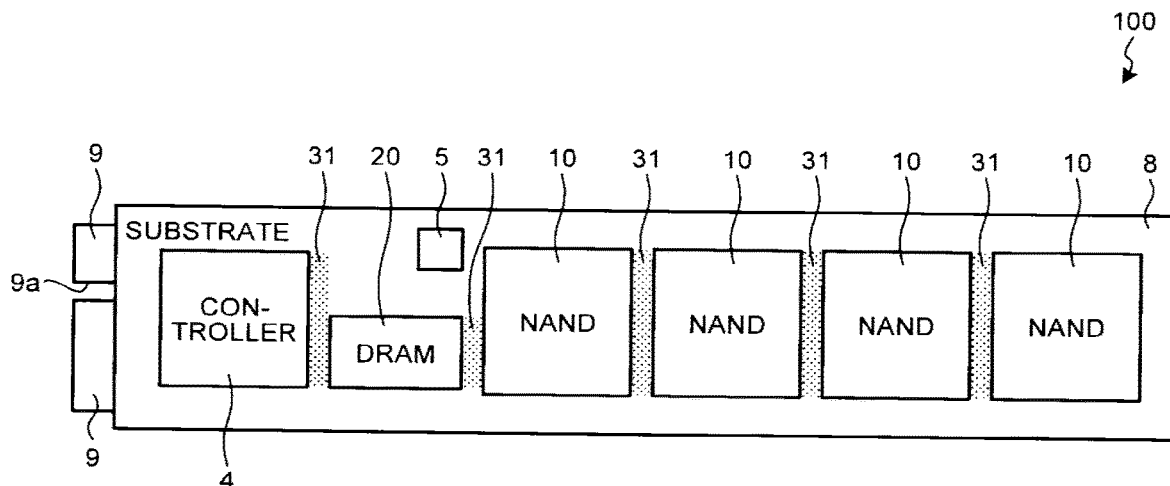
FIG. 2B is a plan view of a schematic configuration of a semiconductor memory system as other examples.
Figure 3B:
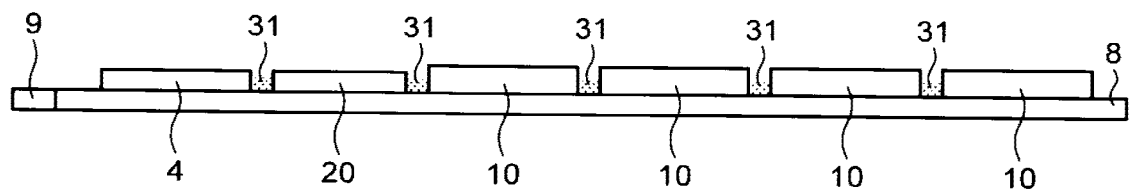
FIG. 3B is a side view of the semiconductor memory system shown in FIG. 2B.

FIG. 2B is a plan view of a schematic configuration of the semiconductor memory system 100 as other examples. FIG. 3B is a side view of the semiconductor memory system 100 shown in FIG. 2B. Thus, the adhesive portion 31 may be filled between the NAND memory 10 and the RAM 20.

Figure 10:
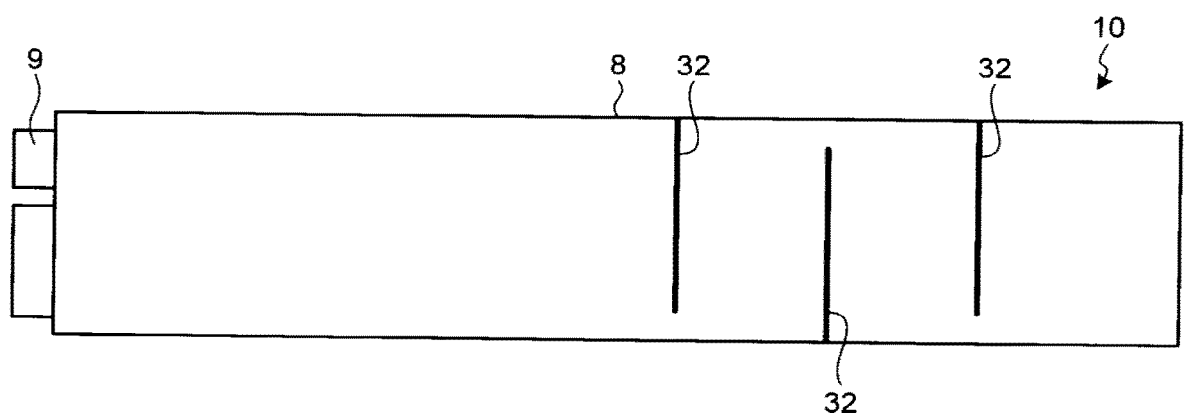
FIG. 10 is a view of slits formed in a seventh layer of the substrate.

FIG. 10 is a view of slits formed in the seventh layer of the substrate 8. FIG. 10 shows a state seen from the rear surface layer side of the substrate 8 and shows the eighth layer in an abbreviated manner.
Further, the NAND memory 10 mounted on the surface layer side is represented by dotted line. In the seventh layer of the substrate 8, a plane layer is formed as a wiring layer. As shown in FIG. 10, in the seventh layer of the substrate 8, the wiring pattern as a plane layer is formed over the substantially entire seventh layer, in part of which slits 32 (i.e., parts in which the wiring layer is not formed) are provided. The slits 32 are provided in parts facing the gaps between the NAND memories 10, in the wiring pattern formed over the substantially entire seventh layer.

FIG. 7 is a view of the wiring density of each substrate layer as a comparison example. As shown in the comparison example of FIG. 7, in a conventional substrate, the eighth layer is formed with a plane layer and therefore the wiring density is approximately 90%. Accordingly, the wiring density of the lower layer is 75%, which increases the difference from the wiring density of the upper layer (approximately 60%). By varying the wiring density, the ratio between the insulating film 8a (i.e., synthetic resin) and the wiring part (i.e. copper) in the entire upper layer of the substrate 8 differs from the ratio between the synthetic resin and the copper in the entire lower layer of the substrate 8. By this means, a thermal expansion coefficient varies between the upper layer and the lower layer of the substrate 8. By this thermal expansion coefficient difference, depending on a temperature change in the substrate 8, the warpage having a convex shape (i.e., upper convex shape in FIG. 3) is likely to occur on the surface layer side along the long-side direction of the substrate 8. Such a temperature change is likely to occur in the production process of the semiconductor memory system 100. Also, since a recent semiconductor memory system is requested to be miniaturized, the substrate 8 tends to become thinner, and therefore such a warpage is likely to occur.

On the other hand, in the present embodiment, the wiring density of the eighth layer is adjusted to a range of approximately 30% to 60% to make the wiring density of the entire upper layer and the wiring density of the entire lower layer substantially equal, so that the thermal expansion coefficients are substantially the same. Therefore, it is possible to suppress an occurrence of the warpage in the substrate 8. Also, the wiring density is adjusted in the eighth layer which is the farthest from the center line 30 (see FIG. 4), so that it is possible to cause a larger moment to suppress the warpage.

Also, the wiring density is adjusted in the eighth layer of the substrate 8, so that, compared to a case where the wiring density is adjusted in a layer in which a wiring layout is restricted such as a signal layer, it is possible to simplify the wiring design and reduce costs.

Also, the adhesive portion 31 is filled in the gap between adjacent NAND memories 10, so that, by the bonding force of the adhesive portion 31, the force of drawing the NAND memories 10 occurs as shown in arrows X of FIG. 9. This force of drawing the NAND memories 10 counteracts the warpage force of reflexing the substrate 8 such that the first layer side has a convex shape, so that it is possible to suppress an occurrence of warpage of the substrate 8. As long as the adhesive portion 31 is filled, such force occurs between the controller 4 and the NAND memories 10, between the controller 4 and the DRAM 20, and between the NAND memories 10 and the DRAM 20.

Further, it is provided in parts facing the gaps between the NAND memories 10 in the wiring pattern formed over the substantially entire area of the seventh layer of the substrate 8, so that the wiring pattern bonding force in the slits 32 is weakened. Therefore, the force of counteracting the force (see arrows X in FIG. 9) caused by filling the adhesive portion 31 in the gap between NAND memories 10 is weakened, so that it is possible to suppress an occurrence of warpage of the substrate 8 more efficiently.

Here, in the present embodiment, although a wiring layer of the eighth layer is set to a net wiring layer to suppress the wiring density of the entire lower layer of the substrate 8, it is not limited to this, and, for example, the wiring layer may be formed on a line. Also, by adjusting the wiring densities of wiring layers in other layers than the eighth layer (i.e., fifth to seventh layers) in the lower layer, the wiring density of the entire lower layer may be adjusted. It is natural that the wiring density of the entire lower layer may be adjusted by adjusting the wiring densities of all layers from the fifth to eighth layers.

Also, a layer in which the slits 32 are formed is not limited to the seventh layer. It may be formed in other layers than the seventh layer in the lower layer (i.e., fifth, sixth and eighth layers).

Figure 11:
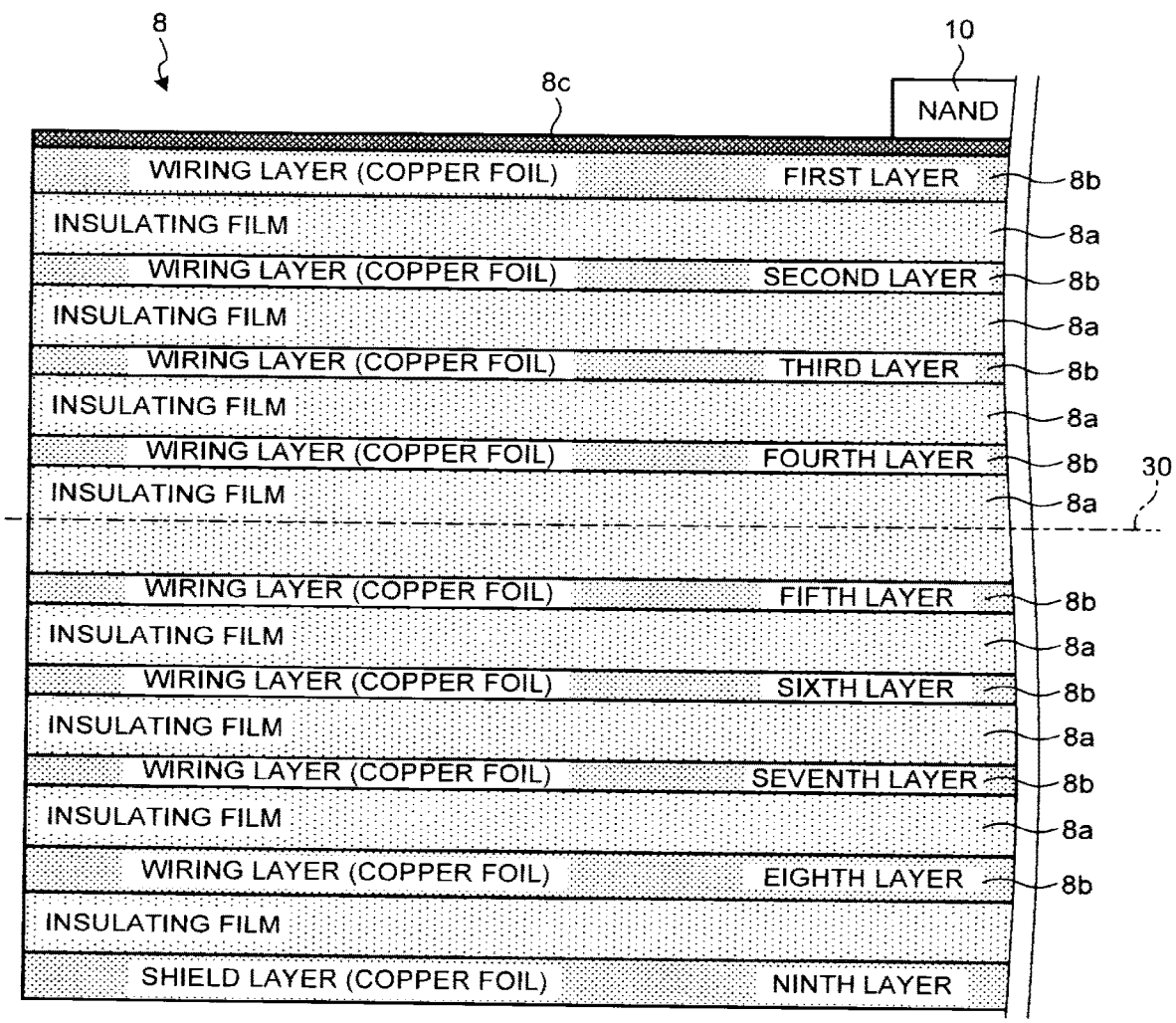
FIG. 11 is a view of a substrate layer configuration provided in a semiconductor memory system according to a second embodiment.

FIG. 11 is a view of a substrate layer configuration provided in a semiconductor memory system according to a second embodiment. In the present embodiment, the outermost layer is provided outside the eighth layer of the substrate 8 as a ninth layer.
Then, the entire outermost layer is covered by copper foil to be a shield layer. Thus, by covering the entire outermost layer by copper foil, it is possible to prevent noise leaked from the semiconductor memory system more reliably. Also, a shield layer may be provided by covering the entire layer inside the ninth layer by copper foil.

Figure 14:
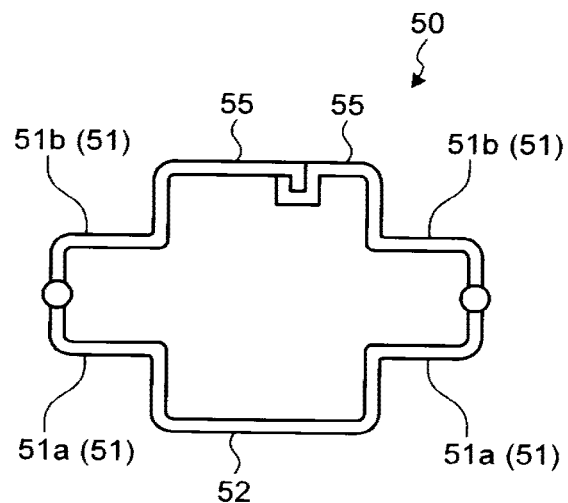
FIG. 14 is a front view of a holding member according to a variation example of the third embodiment.
Figure 16:
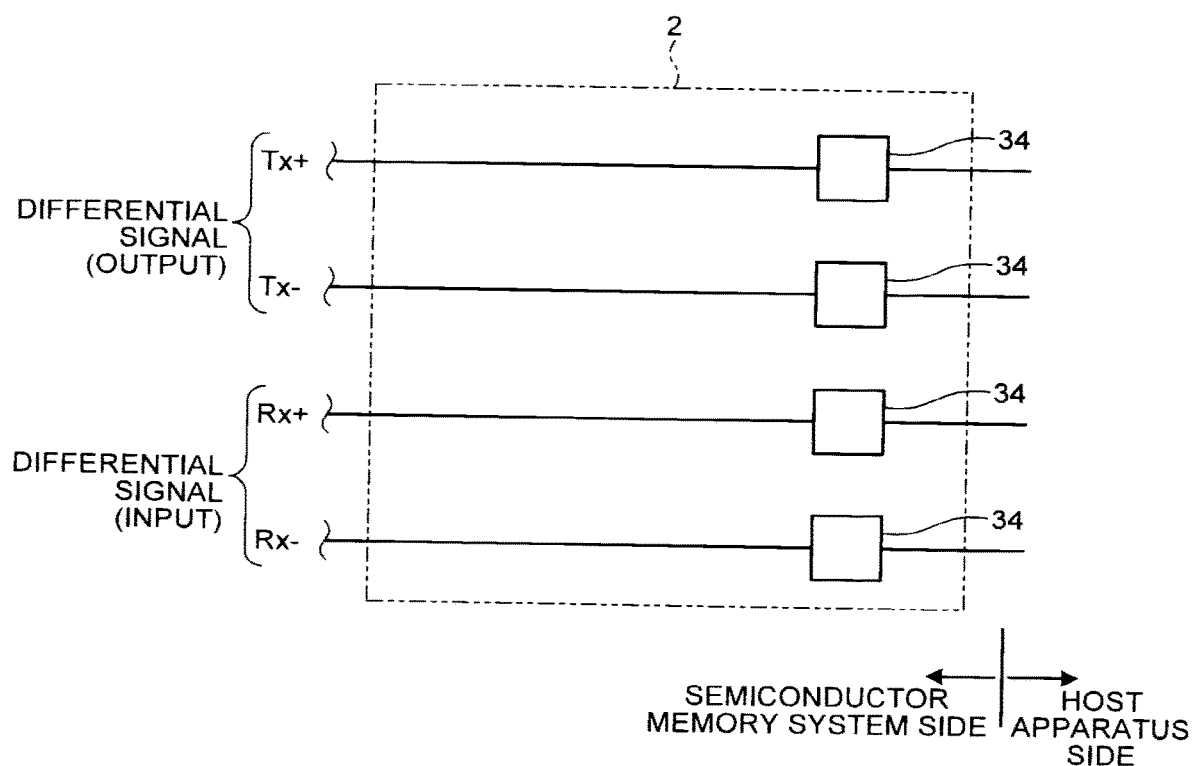
FIG. 16 is a view of a configuration example of a SATA interface.

FIG. 16 is a view of a configuration example of the SATA interface 2. In the semiconductor memory system exemplified in the above-described embodiment, there is a case where transmission of high-speed signals is required. To maintain the signal quality in the case of transmitting high-speed signals, it may be required to adjust the characteristic impedance of a transmission line, optimize the cutoff frequency in the differential mode insertion loss characteristic and insert an appropriate choke coil in the transmission line. FIG. 14 shows an example where choke coils 34 are inserted in the input terminals and output terminals of the SATA interface 2. Here, the insertion positions of the choke coils 34 are preferably the input and output terminals of the SATA interface 2 but may be close to a device (such as the drive control circuit 4).

Figure 12:
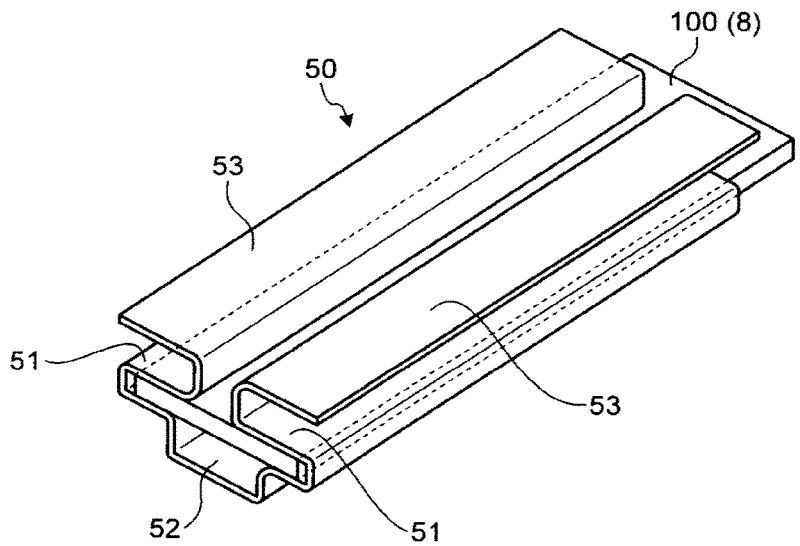
FIG. 12 is an external perspective view of a holding member used in a carrying method of a semiconductor memory system according to a third embodiment.
Figure 13:
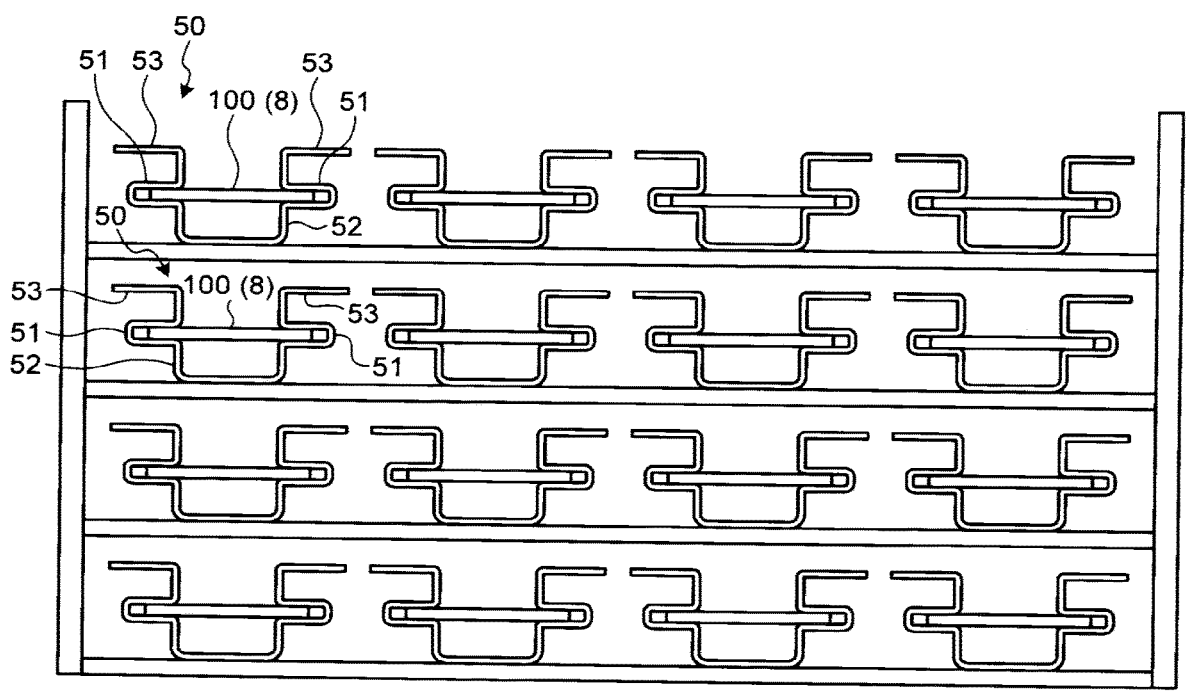
FIG. 13 is a cross-sectional view of a state where the holding member shown in FIG. 12 is put in a box.

FIG. 12 is an external perspective view of a holding member used in a carrying method of a semiconductor memory system according to a third embodiment. FIG. 13 is a cross-sectional view of a state where the holding member shown in FIG. 12 is put in a box. In the present embodiment, the semiconductor memory system 100 is wrapped by a holding member 50 and then carried. The holding member 50 suppresses the warpage of the substrate 8 due to time-dependent changes.

The holding member 50 has tucking and holding portions 51 and a connecting portion 52. Two tucking and holding portions 51 are provided for one holding member 50. The tucking and holding portions 51 tuck and hold parts along the long-side direction of the substrate 8. To hold the substrate 8 on both sides, two tucking and holding portions 51 are provided for one holding member. The tucking and holding portions 51 are formed in a cross-sectional horseshoe shape and tuck the parts along the long-side direction of the substrate 8 therein. The tucking and holding portions 51 suppress the warpage of the substrate 8 to counteract the force of causing the warpage along the long-side direction of the substrate 8 according to time-dependent changes. Therefore, the tucking and holding portions 51 are formed with strength to be able to counteract the force of reflexing the substrate 8.

Also, to counteract the warpage of the substrate 8, it is preferable that the tucking and holding portions 51 are close to the substrate 8 in a state where the substrate 8 is held. It may be configured such that, for example, the gaps formed in the tucking and holding portions 51 are formed slightly narrower than the thickness of the substrate 8 and the substrate 8 is inserted in the tucking and holding portions 51 with widening the gaps. Also, it may be configured such that the width substantially equal to or slightly wider than that of the substrate 8 is formed and the substrate 8 is easily inserted in the gap.

The connecting portion 52 connects the two tucking and holding portions 51. By this means, it is possible to unify the holding member 50. As shown in FIG. 13, in a case where a plurality of semiconductor memory systems 100 are put in a box, the connecting portion 52 holds the intervals between the semiconductor memory systems 100 and also functions as a shock-absorbing member for cushioning the shock given to the semiconductor memory systems 100 at the carry time.

Here, interval holding portions 53 are formed in the tucking and holding portions 51 individually. The interval holding portions 53 are formed so as to extend on the opposite side with respect to the tucking and holding member 51 to the side on which the connecting portions 52 are provided. As shown in FIG. 13, in a case where a plurality of semiconductor memory systems 100 are put in a box, the interval holding portions 53 hold the intervals between the semiconductor memory systems 100 and also function as a shock-absorbing member for cushioning the shock given to the semiconductor memory systems 100 at the carry time.

Also, although the present embodiment has been described where the tucking and holding portions 51 tuck the substrate 8, the substrate 8 is provided with electronic components (not shown) such as a resistance and capacitor and the NAND memory 10. Therefore, in a case where, for example, electronic components are provided in the surrounding part of the substrate 8, it is necessary to form the tucking and holding portions 51 with widths at which it is possible to tuck the substrate 8 and the electronic components collectively.

FIG. 14 is a front view of the holding member 50 according to a variation example of the third embodiment. In the present variation example, the tucking and holding portion 51 is configured with a fixing portion 51a and a moving portion 51b. The fixing portion 51a and the moving portion 51b are connected to be rotatable in the bottom part of the gap formed in the tucking and holding portion 51 and be able to open and close the moving portion 51b. In each of the moving portions 51b, a closure portion 55 is formed. As shown in FIG. 14, the closure portion 55 and the moving portion 51b are pulled toward each other when the moving portion 51b is closed, to hold a state where the moving portion 51b is closed. Also, in the state where the moving portion 51b is closed, the gap width formed in the tucking and holding portion 51 is kept constant.

Figure 15:
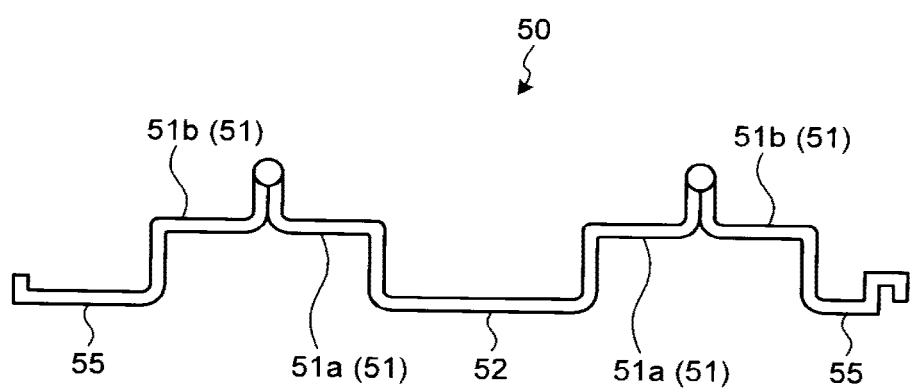
FIG. 15 is a view of a state where a moving portion of the holding member shown in FIG. 14 is opened.

FIG. 15 is a view of a state where the moving portion 51b of the holding member 50 shown in FIG. 14 is opened. As shown in FIG. 15, by opening the moving portion 51b, it is possible to widen the gap of the tucking and holding portion 51. In a state where the gap of the tucking and holding portion 51 is widened, by placing the semiconductor memory system 100 on the fixing portion 51a and closing the moving portion 51b, compared to a case where the semiconductor memory system 100 is inserted into the tucking and holding portion 51 with widening the gap, it is easily possible to hold the semiconductor memory system 100 in the holding member 50.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the sprit of the inventions. The accompanying claims and their equivalents are intended to cover such forms or modifications as would fall within the scope and spirit of the inventions.

What is claimed is:

1. A semiconductor device comprising:
   a substrate; and
   a plurality of nonvolatile semiconductor memories on the substrate,
   wherein the substrate includes:
      a first metal layer having a first pattern density, the first metal layer being electrically connected to the nonvolatile semiconductor memories and being located on a first side of the substrate;
      a second metal layer having a second pattern density, the second metal layer being located on a second side of the substrate;
      a plurality of third metal layers disposed between the first and second metal layers and having respective third pattern densities; and
      insulating layers provided between the first metal layer and a first one of the third metal layers adjacent to the first metal layer, between the second metal layer and a second one of the third metal layers adjacent to the second metal layer, and between adjacent ones of the third metal layers,
      a first group of metal layers includes n metal layers including the first metal layer and (n−1) adjacent third metal layers, a second group of metal layers includes n metal layers including the second metal layer and (n−1) adjacent third metal layers different from the (n−1) third metal layers in the first group, a first density obtained from the first and third pattern densities of the first group of metal layers is substantially equal to a second density obtained from the second and third pattern densities of the second group of metal layers, at least one of the first and third pattern densities of the first group of metal layers and the second and third pattern densities of the second group of metal layers is 80% or greater, and a fourth metal layer is one of the third metal layers that faces the first metal layer with one or more of the insulating layers between the fourth metal layer and the first metal layer, wherein a pattern density of the fourth metal layer is 80% or greater.

2. The device according to claim 1, wherein
the first density comprises an average of the first pattern density and the third pattern densities of the third layers in the first group of metal layers; and
the second density comprises an average of the second pattern density and the third pattern densities of the third layers in the second group of metal layers.

3. The device according to claim 1, wherein at least one of the third metal layers comprises a shield layer.

4. The device according to claim 1, wherein the second metal layer is a mesh layer.

5. The device according to claim 1, wherein
the first metal layer is a signal layer;
a first one of the third metal layers in the first group of metal layers is a plane layer;
third metal layers in the first group of metal layers other than the first one of the third metal layers are signal layers;
the second metal layer is a mesh layer;
a second one of the third metal layers in the second group is a signal layer; and
third metal layers in the second group of metal layers other than the second one of the third metal layers are plane layers.

6. The device according to claim 1, wherein
at least one of the third metal layers in the first group of metal layers comprises a plane layer; and
at least one of the third metal layers in the second group of metal layers comprises a signal layer.

7. The device according to claim 1, wherein the device consists of 2n layers.

8. The device according to claim 1, wherein the first density is about 60% and the second density is about 60%.

9. The device according to claim 1, comprising slits formed in one of the layers in the second group of metal layers.

* * * * *